(12) United States Patent
Ikeda (10) Patent No.: US 8,145,162 B2
(45) Date of Patent: Mar. 27, 2012

(54) TUNER DEVICE

(75) Inventor: Mitsuru Ikeda, Tokyo (JP)

(73) Assignee: Sony Corporation, Tokyo (JP)

( * ) Notice: Subject to any disclaimer, the term of this patent is extended or adjusted under 35 U.S.C. 154(b) by 314 days.

(21) Appl. No.: 12/606,450

(22) Filed: Oct. 27, 2009

(65) Prior Publication Data

US 2010/0112969 A1 May 6, 2010

(30) Foreign Application Priority Data

Oct. 31, 2008 (JP) ................. 2008-281571

(51) Int. Cl.
*H04B 1/18* (2006.01)

(52) U.S. Cl. .................. 455/188.1; 455/190.1; 455/255

(58) Field of Classification Search .................. 455/130, 455/132, 180.1, 188.1, 189.1, 190.1, 191.1, 455/255, 256, 260, 265, 266
See application file for complete search history.

(56) References Cited

U.S. PATENT DOCUMENTS

| | | | |
|---|---|---|---|
| 7,003,274 B1* | 2/2006 | Olip | 455/260 |
| 7,340,230 B2* | 3/2008 | Khoini-Poorfard et al. | 455/132 |
| 2004/0248532 A1 | 12/2004 | Khoini-Poorfard | |
| 2005/0260961 A1 | 11/2005 | Cowley et al. | |
| 2007/0021083 A1* | 1/2007 | Maejima | 455/255 |

FOREIGN PATENT DOCUMENTS

| | | |
|---|---|---|
| EP | 1 748 566 A2 | 7/2006 |
| JP | 2002-300488 A | 10/2002 |
| JP | 2003-110425 A | 4/2003 |
| JP | 2003-218716 A | 7/2003 |
| JP | 2004-214715 | 7/2004 |
| JP | 2006-173922 A | 6/2006 |
| WO | WO 98/32233 A2 | 7/1998 |
| WO | WO 2007/125775 A1 | 11/2007 |
| WO | WO 2008/073768 A1 | 6/2008 |

\* cited by examiner

*Primary Examiner* — Thanh Le
(74) *Attorney, Agent, or Firm* — Wolf, Greenfield & Sacks, P.C.

(57) ABSTRACT

A tuner device includes tuner circuits, where each of the tuner circuits includes a radio frequency amplifier amplifying a radio frequency signal of a transmitted broadcast wave, a frequency mixing circuit performing frequency conversion for the transmitted radio frequency signal, and a local oscillation circuit transmitting a local oscillation signal to the frequency mixing circuit, wherein the local oscillation circuit includes, at least, a reference signal source, a first frequency divider, and a second frequency divider, oscillates a local oscillation signal having a local oscillation frequency, and makes a difference between local oscillation frequencies of the tuner circuits, the difference being generated when the tuner circuits receive the broadcast waves of the same frequency, greater than or equal to a predetermined value.

11 Claims, 5 Drawing Sheets

| $f_{REF}$ [kHz] | $f_{OSC1}$ [kHz] ($M_1$ = 24, $N_1$ = 900) | $f_{OSC1}$ [kHz] ($M_1$ = 28, $N_1$ = 1050) | $f_{OSC1}$ [kHz] ($M_1$ = 50, $N_1$ = 1875) | $f_{OSC1}$ [kHz] ($M_1$ = 64, $N_1$ = 2400) |
|---|---|---|---|---|
| 4000 | 150000 | 150000 | 150000 | 150000 |
| 4000.12 | 150004.5 | 150004.5 | 150004.5 | 150004.5 |
| 3999.88 | 149995.5 | 149995.5 | 149995.5 | 149995.5 |

FIG. 3B

| $f_{REF}$ [kHz] | $f_{OSC2}$ [kHz] ($M_2$ = 24, $N_2$ = 901) | $f_{OSC2}$ [kHz] ($M_2$ = 28, $N_2$ = 1051) | $f_{OSC2}$ [kHz] ($M_2$ = 50, $N_2$ = 1876) | $f_{OSC2}$ [kHz] ($M_2$ = 64, $N_2$ = 2401) |
|---|---|---|---|---|
| 4000 | 150167 | 150143 | 150080 | 150062.5 |
| 4000.12 | 150171.2 | 150147.4 | 150084.5 | 150067 |
| 3999.88 | 150162.2 | 150138.4 | 150075.5 | 150058 |

FIG. 4A

| $f_{REF}$ [kHZ] | $f_{OSC1}$ [kHZ] ($M_1 = 24, N_1 = 4944$) | $f_{OSC1}$ [kHZ] ($M_1 = 28, N_1 = 5768$) | $f_{OSC1}$ [kHZ] ($M_1 = 50, N_1 = 10300$) | $f_{OSC1}$ [kHZ] ($M_1 = 64, N_1 = 13184$) |
|---|---|---|---|---|
| 4000 | 824000 | 824000 | 824000 | 824000 |
| 4000.12 | 824024.7 | 824024.7 | 824024.7 | 824024.7 |
| 3999.88 | 823975.3 | 823975.3 | 823975.3 | 823975.3 |

FIG. 4B

| $f_{REF}$ [kHZ] | $f_{OSC2}$ [kHZ] ($M_2 = 24, N_2 = 4945$) | $f_{OSC2}$ [kHZ] ($M_2 = 28, N_2 = 5769$) | $f_{OSC2}$ [kHZ] ($M_2 = 50, N_2 = 10302$) | $f_{OSC2}$ [kHZ] ($M_2 = 64, N_2 = 13186$) |
|---|---|---|---|---|
| 4000 | 824167 | 824143 | 824160 | 824125 |
| 4000.12 | 824191.4 | 824167.6 | 824184.7 | 824149.7 |
| 3999.88 | 824141.9 | 824118.1 | 824135.7 | 824100.3 |

FIG. 5

TUNER DEVICE

BACKGROUND OF THE INVENTION

1. Field of the Invention

The present invention relates to a tuner device including a plurality of tuner circuits.

2. Description of the Related Art

A tuner device included in a television receiver selects the signal of a desired channel from among high frequency signals of television broadcasting, the high frequency signals including a very high frequency (VHF) signal, an ultra high frequency (UHF) signal, and so forth that are received through an antenna, performs frequency conversion for the selected signal so that the selected signal is converted into an intermediate frequency signal, and externally transmits the intermediate frequency signal.

Figure 5:
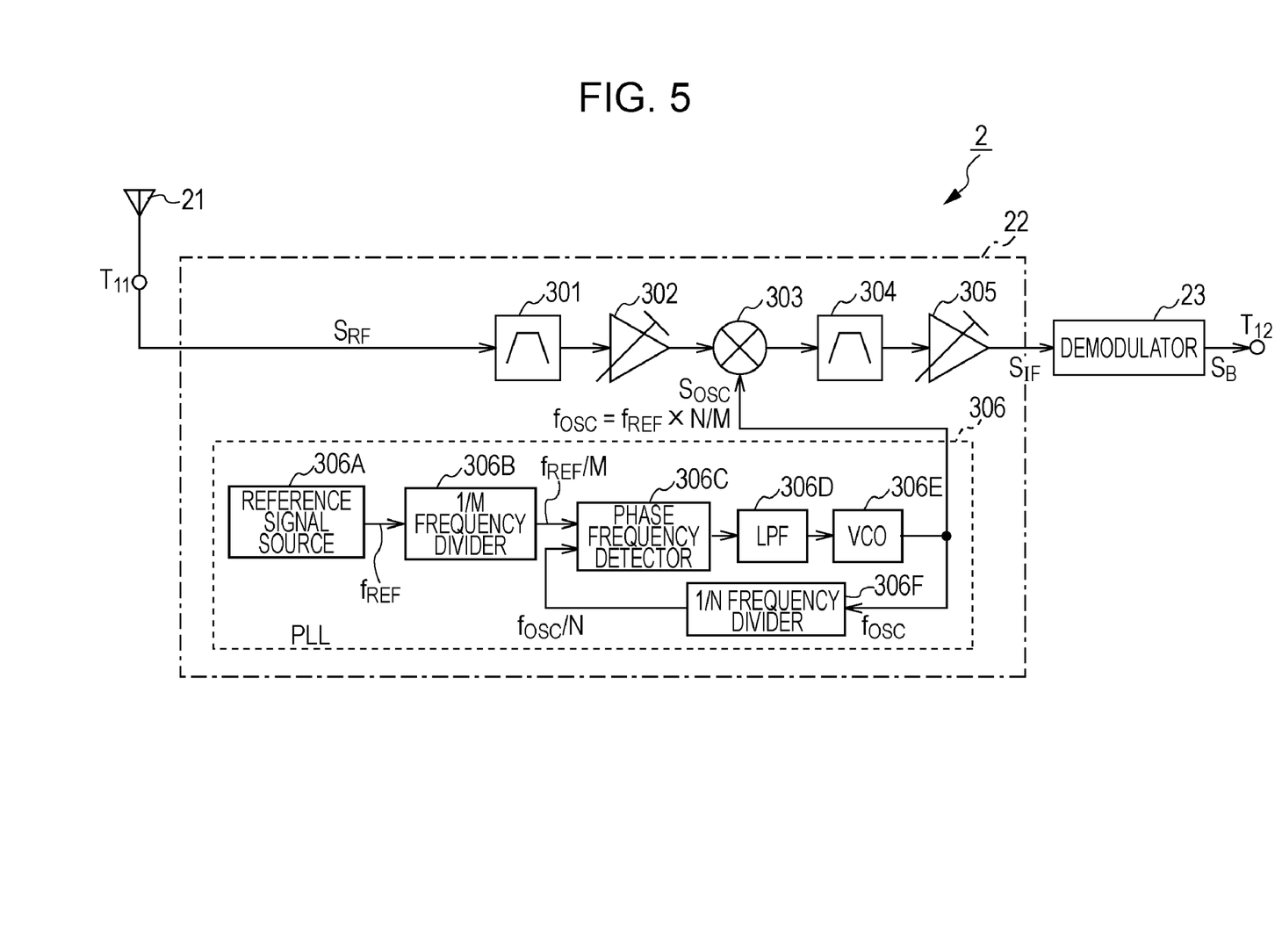
FIG. 5 shows an exemplary internal configuration of a tuner device according to a related art.

FIG. 5 shows an exemplary internal configuration of a tuner device 2 according to a related art. The tuner device 2 includes an antenna 21, an input end $T_{11}$, a tuner circuit 22, a demodulator 23, an output end $T_{12}$, and receives a terrestrial television broadcast wave.

In the tuner device 2, a radio frequency (RF) signal $S_{RF}$ transmitted from the antenna 21 is transmitted to the tuner circuit 22 via the input end $T_{11}$ and subjected to band limitation through a band-pass filter (BPF) 301. The band-limited RF signal is subjected to signal amplification through an RF amplifier 302, and subjected to frequency conversion through a mixer (frequency mixing circuit) 303 so that an intermediate frequency (IF) signal is obtained. The IF signal is band-limited through an IF filter 304, amplified through an IF amplifier 305, demodulated to a baseband signal $S_B$ through the demodulator 23, and externally transmitted from the output end $T_{12}$.

The tuner device 2 includes a phase locked loop (PLL) 306 functioning as a local oscillation circuit, and transmits a local oscillation signal $f_{OSC}$ to the mixer 303. In the PLL 306, a reference signal transmitted from a reference signal source 306A via a 1/M (where the sign M indicates an arbitrary integer greater than or equal to two) frequency divider 306B and a signal transmitted from a voltage controlled oscillator (VCO) 306E via a 1/N (where the sign N indicates an arbitrary integer greater than or equal to two) frequency divider 306F functioning as a comparison signal source are transmitted to a phase frequency detector 306C. The phase frequency detector 306C compares the phase of the reference signal transmitted from the reference signal source 306A via the 1/M frequency divider 306B to that of the signal transmitted from the VCO 306E via the 1/N frequency divider 306F. Then, the phase frequency detector 306C externally transmits the phase difference as a pulse signal. The pulse signal is smoothed through a low pass filter (LPF) 306D, and the smoothed current and voltage of the signal is transmitted to the VCO 306E. Thus, a local oscillation frequency $f_{OSC}$ of the local oscillation signal $S_{OSC}$ oscillated by the PLL 306 is controlled.

Here, in the PLL 306, assuming that the reference frequency of the reference signal source 306A is determined to be $f_{REF}$, and a frequency obtained by dividing the reference frequency $f_{REF}$ at a ratio of 1/M is compared to a frequency obtained by dividing a frequency $f_{OSC}$ transmitted from the VCO 306E at a ratio of 1/N. In that case, the integer M of the 1/M frequency divider 306B and the integer N of the 1/N frequency divider 306F are made variable so that a local oscillation frequency having an arbitrary value obtained through the calculation $f_{REF} \times N/M$ is obtained, as disclosed in Japanese Unexamined Patent Application Publication No. 2004-214715.

SUMMARY OF THE INVENTION

When a plurality of tuner devices having the same configuration as that of the above-described tuner device 2 is provided and each of the tuner devices includes a crystal as a reference signal source, a common difference occurs. Therefore, it becomes difficult to make the values of oscillation frequencies of the reference signal sources equal to each other. Therefore, there is a minute frequency difference between the reference signals of the tuner devices.

If the above-described tuner devices are provided in proximity to each other, a local oscillation signal may leak from each of the tuner devices. The leaked local oscillation signal enters the PLL and the mixer of the tuner device provided in proximity so that the leaked local oscillation signal becomes an interference signal source. If the tuner devices select local oscillation frequencies of the same value, a beat noise or the like appears in an image during the analog signal reception. During the digital signal reception, the occurrence of a block noise, the blackout of an image, and so forth may occur due to the deterioration of appropriate carrier-to-noise (C/N) characteristics.

Accordingly, the present invention has been achieved to provide a tuner device that can reduce the occurrence of the interference signal source when receiving broadcast waves of the same frequency.

Accordingly, a tuner device according to an embodiment of the present invention includes a plurality of tuner circuits, where each of the tuner circuits includes a radio frequency amplifier configured to amplify a radio frequency signal of a transmitted broadcast wave, a frequency mixing circuit configured to perform frequency conversion for the radio frequency signal transmitted from the radio frequency amplifier, and a local oscillation circuit configured to transmit a local oscillation signal to the frequency mixing circuit, wherein the local oscillation circuit includes, at least, a reference signal source, a first frequency divider, and a second frequency divider, oscillates a local oscillation signal having a local oscillation frequency $f_{OSC}=f_{REF} \times N/M$ which is expressed by using a reference frequency $f_{REF}$ of the reference signal source, a first dividing ratio 1/M of the first frequency divider, and a second dividing ratio 1/N of the second frequency divider, and makes a difference between local oscillation frequencies of the tuner circuits, the difference being generated when the tuner circuits receive the broadcast waves of a same frequency, greater than or equal to a predetermined value.

The tuner device according to an embodiment of the present invention allows for reducing the leakage of a local oscillation signal, the leakage occurring in each of the tuner circuits, and an influence upon a different adjacent tuner circuit. Accordingly, the above-described tuner device can reduce the occurrence of an interference wave which becomes the source of a disturbance in the different adjacent tuner circuit even though the same frequency is selected. For example, the above-described tuner device can reduce the occurrence of a noise occurring in an image generated through a television receiver.

DESCRIPTION OF THE PREFERRED EMBODIMENTS

Hereinafter, best modes of performing the present invention (hereinafter referred to as embodiments of the present invention) will be described with reference to the attached drawings. The descriptions will be given in the following order.
1. Tuner device according to an embodiment of the present invention
2. Exemplary modification

1. Tuner Device According to an Embodiment of the Present Invention

Figure 1:
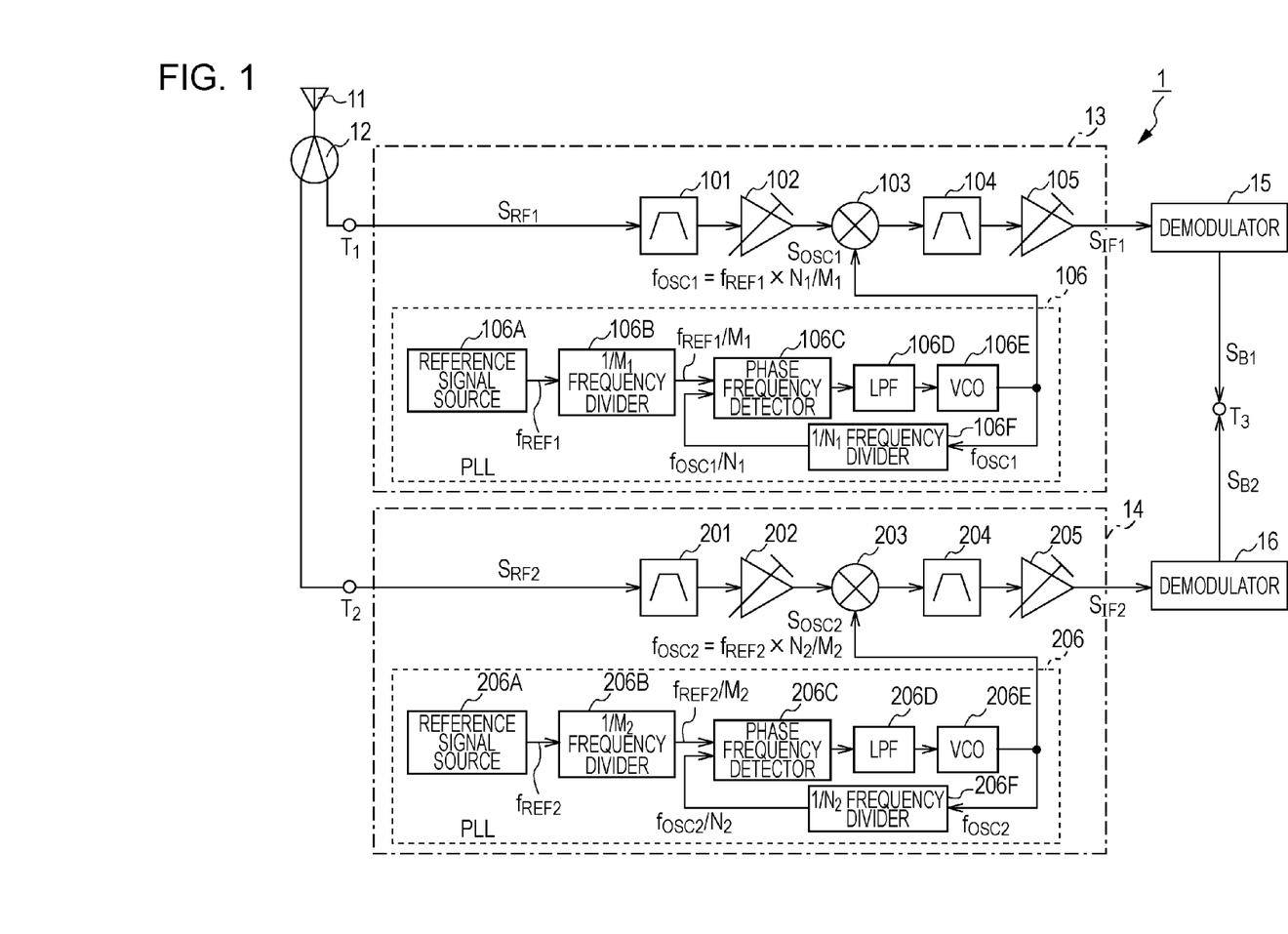
FIG. 1 is a block diagram showing an exemplary internal configuration of a tuner device according to an embodiment of the present invention.

A tuner device according to an embodiment of the present invention includes a plurality of tuner circuits provided in the same cabinet, so as to receive a plurality of broadcast signals at the same time. FIG. 1 is a block diagram showing an exemplary internal configuration of a tuner device 1 according to an embodiment of the present invention.

A tuner device 1 shown in FIG. 1 includes an antenna 11, a distributor 12, input ends $T_1$ and $T_2$, tuner circuits 13 and 14, demodulators 15 and 16, and an output end $T_3$ that are provided in the same cabinet. The tuner circuits 13 and 14 provided in the tuner device 1 can receive broadcast waves of the same frequency.

The tuner device 1 can receive, for example, very high frequencies (VHFs) which are the broadcast waves of 1 to 12 channels of terrestrial analog television broadcasting, and the broadcast waves of 13 to 62 channels of terrestrial digital television broadcasting. Here, the term "VHF" denotes the radio wave of a frequency which falls within a very high frequency band (30 MHz to 300 MHz), and the term "UHF" denotes that of a frequency which falls within an ultrahigh frequency band (300 MHz to 3 GHz).

Here, the tuner circuit 13 has the same block as that of the tuner circuit 14, where each of the tuner circuits 13 and 14 uses the block as its internal configuration. Hereinafter, therefore, the details of the internal configuration of the tuner circuit 13 will be described and that of the tuner circuit 14 will not be described.

The tuner circuit 13 includes a band-pass filter (BPF) 101, a radio frequency (RF) amplifier 102, a mixer (frequency mixing circuit) 103, an intermediate frequency (IF) filter 104, an IF amplifier 105, and a phase locked loop (PLL) functioning as a local oscillation circuit. The tuner circuit 14 includes a BPF 201, an RF amplifier 202, a mixer 203, an IF filter 204, an IF amplifier 205, and a PLL 206.

The distributor 12 divides an RF signal transmitted to the antenna 11 into signals $S_{RF1}$ and $S_{RF2}$ of two systems, transmits the RF signal $S_{RF1}$ to the BPF 101 via the input end $T_1$, and transmits the RF signal $S_{RF1}$ to the BPF 201.

The BPF 101 makes only a reception band component of the transmitted RF signal $S_{RF1}$ pass, and transmits the reception band component to the RF amplifier 102.

The RF amplifier 102 amplifies the signal transmitted from the BPF 101 and transmits the amplified signal to the mixer 103.

The mixer 103 performs frequency conversion for the signal transmitted from the RF amplifier 102. At that time, a local oscillation signal $S_{OSC1}$ is transmitted from the PLL 106 to the mixer 103. The mixer 103 performs the frequency conversion by mixing the signal transmitted from the RF amplifier 102 and the local oscillation signal $S_{OSC1}$, obtains an IF signal, and transmits the IF signal to the IF filter 104.

The IF filter 104 makes only a reception band component of the IF signal transmitted from the mixer 103 pass and transmits the reception band component to the IF amplifier 105.

The IF amplifier 105 amplifies the signal transmitted from the IF filter 104 and transmits a signal $S_{IF1}$ obtained through the amplification to the demodulator 15.

The demodulator 15 demodulates the signal $S_{IF1}$ transmitted from the IF amplifier 105 and obtains a baseband signal $S_{B1}$. Then, the demodulator 15 transmits the baseband signal $S_{B1}$ to the output end $T_3$.

The PLL 106 includes a reference signal source 106A, a $1/M_1$ frequency divider 106B, a phase frequency detector 106C, an LPF 106D, a VCO 106E, and a $1/N_1$ frequency divider 106F.

The reference signal source 106A generates a reference signal (voltage signal) of a reference frequency $F_{REF1}$, and transmits the reference signal to the $1/M_1$ frequency divider 106B.

The reference $1/M_1$ frequency divider 106B frequency-divides the reference frequency $f_{REF1}$ of the voltage signal transmitted from the reference signal source 106A at a frequency division ratio of $1/M_1$ (where the sign $M_1$ denotes an arbitrary integer), and transmits a signal of the frequency $f_{REF1}/M_1$ to the phase frequency detector 106C. A signal of a frequency $f_{OSC1}/N_1$ is also transmitted from the $1/N_1$ frequency divider 106F to the phase frequency detector 106C.

The phase frequency detector 106 compares the phase of the signal of the frequency $f_{REF1}/M_1$, the signal being transmitted from the $1/M_1$ frequency divider, to that of the signal of the frequency $f_{OSC1}/N_1$, the signal being transmitted from the $1/N_1$ frequency divider 106F, and transmits the difference between the phases to the LPF 106D, as a pulse signal.

The LPF 106D makes only a low frequency component of the above-described pulse signal pass so as to smooth the pulse signal transmitted from the phase frequency detector 106C, and transmits the low frequency component to the VCO 106E.

The VCO 106E controls the local oscillation frequency $f_{OCS1}$ of the local oscillation signal $S_{OSC1}$ transmitted to the mixer 103 based on the current and the voltage of a signal which passed through the LPF 106D. The VCO 106 transmits the local oscillation signal $S_{OSC1}$ of the local oscillation frequency $f_{OSC1}$ to the mixer 103 and the $1/N_1$ frequency divider 106F.

The local oscillation frequency $f_{OSC1}$ can be expressed through Equation (1) that follows by using the reference frequency $f_{REF1}$, and the integers $M_1$ and $N_1$.

$$f_{OSC1} = f_{REF1} \times N_1/M_1 \quad \text{Equation (1)}$$

Similarly, a local oscillation frequency $f_{OSC2}$ oscillated by the PLL 206 included in the tuner circuit 14 can be expressed through Equation (2) that follows by using a reference frequency $f_{REF2}$, and integers $M_2$ and $N_2$.

$$f_{OSC2} = f_{REF2} \times N_2/M_2 \quad \text{Equation (2)}$$

The $1/N_1$ frequency divider 106F frequency-divides the local oscillation frequency $f_{OSC}$ of the local oscillation signal $S_{OSC}$ transmitted from the VCO 106E at a frequency division ratio of $1/N_1$ (where the sign $N_1$ denotes an arbitrary integer), and transmits a signal of the frequency $f_{OSC1}$ to the phase frequency detector 106C.

The PLL 106 changes the value of $M_1$ of the $1/M_1$ frequency divider 106B and that of $N_1$ of the $1/N_1$ frequency divider 106F so as to obtain an arbitrary local oscillation frequency $f_{OSC1}$ used as an output frequency of the PLL 106.

In the tuner circuit 14 having the same configuration as that of the above-described tuner circuit 13, the PLL 206 includes a reference signal source 206A, $1/M_2$ frequency divider 206B, a phase frequency detector 206C, an LPF 206D, a VCO 206E, and a $1/N_2$ frequency divider 206F.

In the PLL 206 provided in the tuner circuit 14, as is the case with the PLL 106 provided in the tuner circuit 13, the reference signal source 206A generates a voltage signal of the reference frequency $f_{REF2}$ and transmits the voltage signal to the $1/M_2$ frequency divider 206B. The $1/M_2$ frequency divider 206B frequency-divides the reference frequency $f_{REF2}$ of a voltage signal transmitted from the reference signal source 206A at a frequency division ratio of $1/M_2$ (where the sign $M_2$ denotes an arbitrary integer), and transmits a signal of the frequency $f_{REF2}/M_2$ to the phase frequency detector 206C.

The phase frequency detector 206C compares the phase of the signal of the frequency $f_{REF2}/M_2$, the signal being transmitted from the $1/M_2$ frequency divider 206B, to that of the signal of the frequency $f_{OSC2}/N_2$, the signal being transmitted from the $1/N_2$ frequency divider 206F, and transmits the phase difference to the LPF 206D as a pulse signal. The LPF 206D makes only a low frequency component of the transmitted pulse signal pass, and transmits the low frequency component to the VCO 206E.

The VCO 206E controls the local oscillation frequency $f_{OCS2}$ of the local oscillation signal $S_{OSC2}$ transmitted to the mixer 203 based on the current and the voltage of a signal which passed through the LPF 206D. The VCO 206E transmits the local oscillation signal $S_{OSC2}$ of the local oscillation frequency $f_{OSC2}$ to the mixer 203 and the $1/N_2$ frequency divider 206F.

Here, an example where the tuner circuits 13 and 14 select the same channel and receive broadcast waves of the same frequency will be described.

In that case, theoretically, the tuner circuits 13 and 14 should obtain local oscillation signals of the same frequency. Therefore, theoretically, the integer $M_1$ of the $1/M_1$ frequency divider 106B and the integer $M_2$ of the $1/M_2$ frequency divider 206B should be set to the same value, and the integer $N_1$ of the $1/N_1$ frequency divider 106F and the integer $N_2$ of the $1/N_2$ frequency divider 206F should be set to the same value. Further, theoretically, the reference frequency $f_{REF1}$ of the reference signal source 106A and the reference frequency $f_{REF2}$ of the reference signal source 206A should be set to the same value.

However, when each of the reference signal sources 106A and 206A includes a crystal oscillator, there is a common difference between crystals in general. Therefore, a minute difference occurs between the reference frequencies $f_{REF1}$ and $f_{REF2}$. Thus, a tuner device including a plurality of tuner circuits exhibits variations in reference frequencies of the reference signal sources.

The tuner circuit 13 includes, for example, the reference signal source 106A of which reference frequency $f_{OSC1}$ is 4000 kHz so as to obtain the local oscillation signal $S_{OSC1}$ of which local oscillation frequency $f_{OSC1}$ is 824143 kHz. In that case, if the integer $M_1$ of the $1/M_1$ frequency divider 106B is determined to be 28, the integer $N_1$ of the $1/N_1$ frequency divider 106F is determined to be 5769. The local oscillation frequency $f_{OSC1}$ is expressed by the equation $f_{OSC1} = 4000 \times 5769/28 = 824143$ [kHz] in accordance with Equation (1).

Here, the reference frequency $f_{REF2}$ of the reference signal source 206A included in the tuner circuit 14 is determined to be 4000.01 kHz which is shifted from the reference frequency of the reference signal source 106A included in the tuner circuit 13 by as much as 0.01 kHz. In that case, if the integer $M_2$ of the $1/M_2$ frequency divider 206B is determined to be 28, and the integer $N_2$ of the $1/N_2$ frequency divider 106F is determined to be 5769, the local oscillation frequency $f_{OSC2}$ can be expressed by the equation $f_{OSC2} = 4000.01 \times 5769/28 = 824145$ [kHz] in accordance with Equation (1).

Usually, the common difference between crystals of the crystal oscillators that are included in the individual reference signal sources 106A and 206A is plus and minus 100 ppm in consideration of temperature characteristics. Each of the local oscillation frequencies $f_{REF1}$ and $f_{REF2}$ depends on the above-described common difference. Therefore, even though efforts are made to obtain local oscillation frequencies of the same value through a plurality of tuner circuits, the local oscillation frequencies are shifted from each other by as much as a few Hz to a few kHz in actuality. According to the above-described example, the difference between the local oscillation frequencies of the PLL 206 and PLL 106 (offset frequency $fL_0$) is expressed by the equation 824145−824143=2 [kHz].

Usually, if the value of an offset frequency observed between the tuner circuits provided in the tuner device is about 5 kHz or less, an interference wave occurs between the tuner circuits. If the offset frequency is small as described above, a beat noise occurs in an image when the tuner device receives an analog broadcast, and a block noise occurs when the tuner device receives a digital broadcast, for example. Therefore, in the tuner device including the plurality of tuner circuits, an offset frequency should be set so as to reduce an interference wave occurring between the tuner circuits. If the value of the offset frequency is unnecessarily increased between the tuner circuits, a signal for reception may lie outside the BPF band. Consequently, the signal quality may be reduced and the tuner circuits may receive broadcast signals of the same channel with difficulty.

Therefore, in the tuner device 1 of the above-described embodiment, the tuner circuits 13 and 14 obtain an offset frequency $fL_0$ which reduces a disturbance caused by the interference wave while each of the tuner circuits 13 and 14 is appropriately retaining the characteristic thereof.

Figure 2:
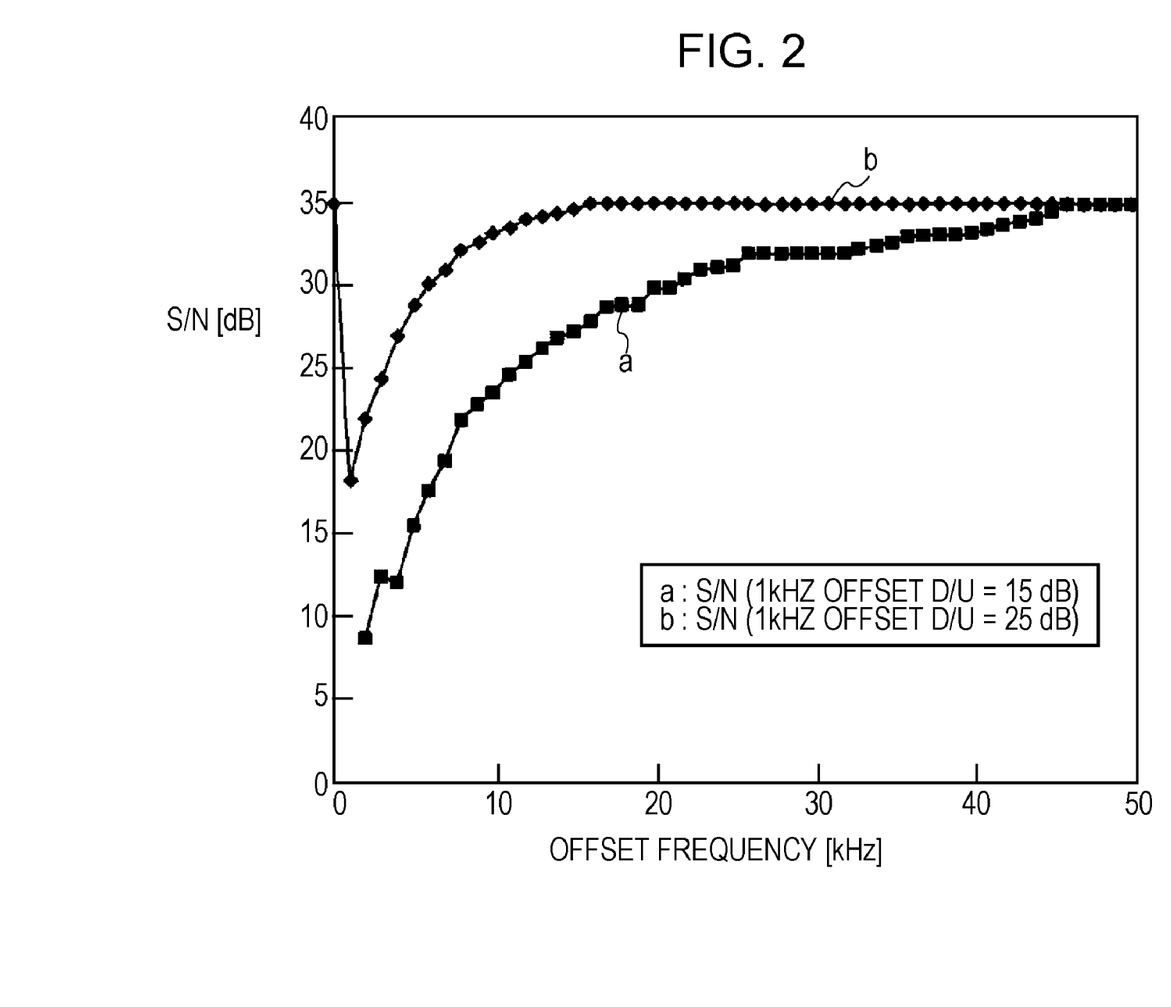
FIG. 2 shows an S/N ratio [dB] in contrast with an offset frequency [kHz] observed when a broadcast signal of terrestrial digital television broadcasting is transmitted to a tuner device according to an embodiment of the present invention.

FIG. 2 shows the signal-to-noise (S/N) ratio [dB] of a transmitted broadcast signal in contrast with the offset frequency $fL_0$ [kHz] observed when a broadcast signal of the terrestrial digital television broadcasting is transmitted to the tuner device 1.

Usually, a desired wave-to-undesired wave (D/U) power ratio indicates the ratio of the power of a desired wave to that of an undesired wave, which is obtained at a predetermined output end. As the D/U power ratio is increased, the signal quality is less deteriorated. In FIG. 2, curve a indicates an S/N ratio obtained when the offset frequency $fL_0$ is 1 kHz and the D/U power ratio between the local oscillation signal and the undesired wave is 15 dB. Further, curve b indicates an S/N ratio obtained when the offset frequency $fL_0$ is 1 kHz and the D/U power ratio between the local oscillation signal and the undesired wave is 25 dB. That is to say, the curve b is measured when the signal quality is higher than that observed when the curve a is measured.

In FIG. 2, the curve b indicates that the S/N ratio attains its maximum value, that is, 35 dB when the offset frequency $fL_0$ is approximately 20 kHz or more, and the curve a indicates that the S/N ratio attains its maximum value, that is, 35 dB when the offset frequency $fL_0$ is approximately 50 kHz or more.

As is evident from FIG. 2, the S/N ratio is stabilized when the value of the offset frequency $fL_0$ is 50 kHz or more in each of the tuner circuits 13 and 14. Consequently, the characteristic problem occurring in each of the tuner circuits 13 and 14 is reduced and a high-quality reception signal is obtained. Further, since the offset frequency $fL_0$ is set to 200 kHz or less in each of the tuner circuits 13 and 14, each of signals for reception falls within the band of each of the IF filters 104 and 204 so that the signal quality is not deteriorated. Consequently, in the tuner device 1, the value of the offset frequency $fL_0$ observed between the tuner circuits 13 and 14 should fall within the 50- to 200-kHz range.

In the above-described embodiment, as a method of setting the difference between the local oscillation frequencies $f_{OSC1}$ and $f_{OSC2}$, for example, the difference between the local oscillation frequencies $f_{OSC1}$ and $f_{OSC2}$ may be set while measuring the obtained local oscillation frequencies $f_{OSC1}$ and $f_{OSC2}$. According to the above-described method, however, the shift width is varied due to the value of the obtained local oscillation frequency, which compromises the effectiveness.

According to the above-described embodiment, therefore, the integers $M_1$ and $N_1$ that are used in Equation (1) and the integers $M_2$ and $N_2$ that are used in Equation (2) are set so that the value of the offset frequency $fL_0$ falls within the 50- to 200-kHz range.

The tuner device 1 is provided with data of a table showing a combination of the integers $M_1$ and $N_1$, and the integers $M_2$ and $N_2$ of each of channels of all of receivable broadcast waves in part of the area of each of random access memories (RAMs) that are not shown.

Further, the tuner device 1 is provided with a central processing unit (CPU) and a read only memory (ROM) that are not shown. The CPU reads data of the combination of the integers $M_1$ and $N_1$, and the integers $M_2$ and $N_2$, the combination being attained based on the channel of a transmitted broadcast wave, and performs control to set the frequencies $f_{OSC1}$ and $f_{OSC2}$. When the tuner device 1 is connected to a host device, the same control as the above-described control may be performed through a microcomputer provided in the host device. The above-described microcomputer may calculate the combination of the integers $M_1$ and $N_1$, and the integers $M_2$ and $N_2$ according to a calculation method other than floating-point arithmetic.

Figure 3A:
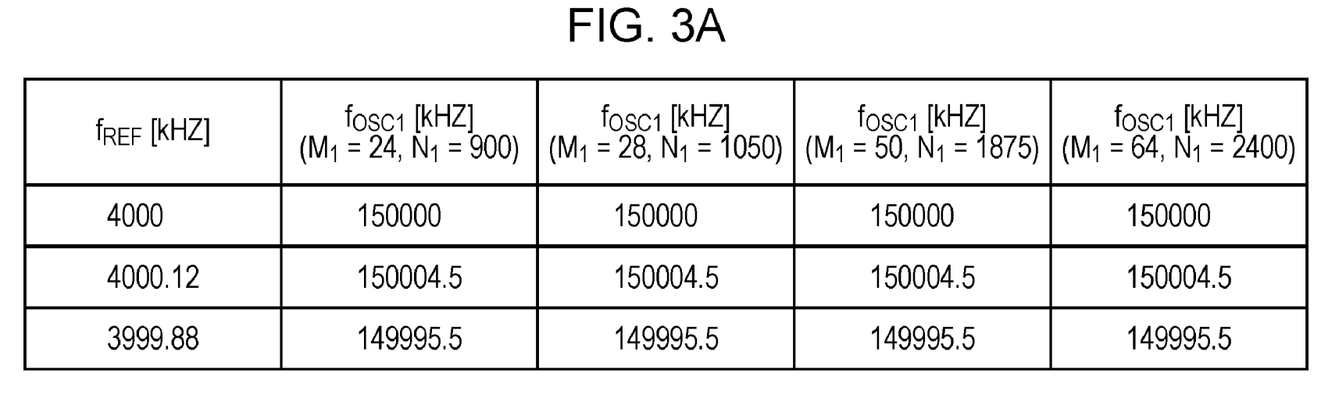
FIG. 3A shows a local oscillation frequency exemplarily set upon receiving a broadcast wave with VHF1ch and a tuning frequency $f_0$=93 MHz.
Figure 3B:
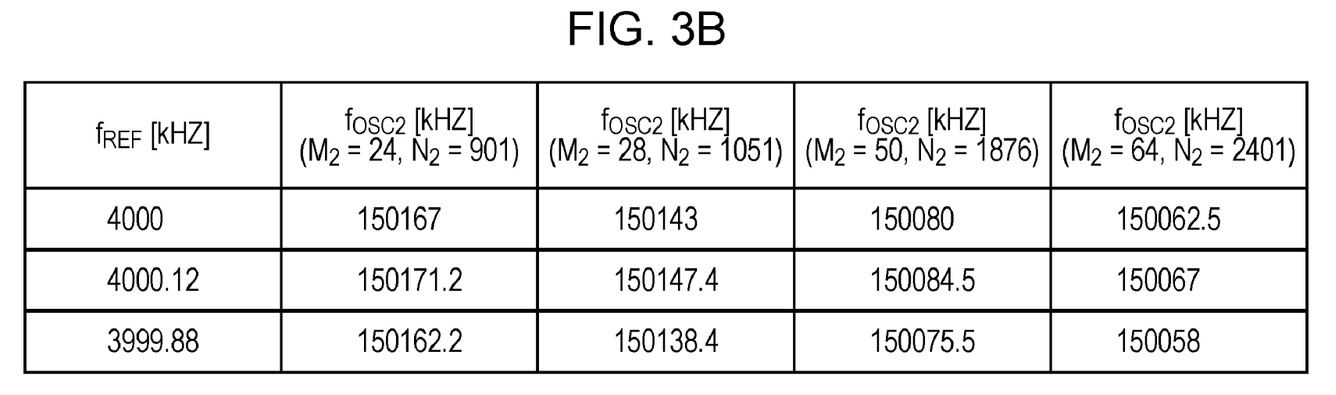
FIG. 3B shows another local oscillation frequency exemplarily set upon receiving the broadcast wave with VHF1ch and the tuning frequency $f_0$=93 MHz.

FIG. 3A shows a local oscillation frequency exemplarily set in the tuner circuit 13 upon receiving a broadcast wave with a VHF1ch and a tuning frequency $f_0$=93 MHz in the above-described embodiment. FIG. 3B shows a local oscillation frequency exemplarily set in the tuner circuit 14 upon receiving the above-described broadcast wave.

FIG. 3A shows an exemplarily set local oscillation frequency $f_{OSC1}$ of a local oscillation signal $S_{OSC1}$ oscillated by the PLL 106 included in the tuner circuit 13.

As shown in FIG. 3A, the tuner circuit 13 includes a crystal oscillator with a reference frequency $f_{REF1}$=4000 [kHz], as the reference signal source 106A. At that time, the integers $M_1$ and $N_1$ are set, for example, as shown by the equations $M_1$=24 and $N_1$=900, $M_1$=28 and $N_1$=1050, $M_1$=50 and $N_1$=1875, and $M_1$=64 and $N_1$=2400. In any case, the local oscillation frequency $f_{OSC1}$ is expressed as the equation $f_{OSC1}$=150000.

Here, a crystal oscillator of which reference frequency $f_{REF1}$ is expressed by the equation $f_{REF1}$=4000.12 [kHz] is used as the reference signal source 106A in place of the above-described crystal oscillator. At that time, the local oscillation frequency $f_{OSC1}$ is expressed by the equation $f_{OSC1}$=150004.6 when any of the equations $M_1$=24 and $N_1$=900, $M_1$=28 and $N_1$=1050, $M_1$=50 and $N_1$=1875, and $M_1$=64 and $N_1$=2400 holds.

Further, a crystal oscillator of which reference frequency $f_{REF1}$ is expressed by the equation $f_{REF1}$=3999.88 [kHz] is used as the reference signal source 106A in place of the above-described crystal oscillator. At that time, the local oscillation frequency $f_{OSC1}$ is expressed by the equation $f_{OSC1}$=149995.5 when any of the equations $M_1$=24 and $N_1$=900, $M_1$=28 and $N_1$=1050, $M_1$=50 and $N_1$=1875, and $M_1$=64 and $N_1$=2400 holds.

FIG. 3B shows an exemplarily set local oscillation frequency $f_{OSC2}$ of a local oscillation signal $S_{OSC2}$ oscillated by the PLL 206 included in the tuner circuit 14. In FIG. 3B, the integer $N_2$ is set so that the equation $N_2$=$N_1$+1 holds in the tuner circuit 14. As shown in FIG. 3B, the tuner circuit 14 includes a crystal oscillator with a reference frequency $f_{REF2}$=4000 [kHz], as the reference signal source 206A. At that time, the integers $M_2$ and $N_2$ are set so that each of the equations $M_2$=24 and $N_2$=900, $M_2$=28 and $N_2$=1051, $M_2$=50 and $N_2$=1876, and $M_2$=64 and $N_2$=2401 holds. In that case, the local oscillation frequency $f_{OSC2}$ becomes each of 150167 kHz, 150143 kHz, 150080 kHz, and 150062.5 kHz.

Here, a crystal oscillator of which reference frequency $f_{REF2}$ is expressed by the equation $f_{REF2}$=4000.12 [kHz] is used as the reference signal source 206A in place of the above-described crystal oscillator. At that time, the value of the local oscillation frequency $f_{OSC2}$ becomes 150171.2 kHz when the equations $M_2$=24 and $N_2$=901 hold. Further, the value of the local oscillation frequency $f_{OSC2}$ becomes 150147.4 kHz when the equations $M_2$=28 and $N_2$=1051 hold. Still further, the value of the local oscillation frequency $f_{OSC2}$ becomes 150084.5 kHz when the equations $M_2$=50 and $N_2$=1876 hold. Still further, the value of the local oscillation frequency $f_{OSC2}$ becomes 150067 kHz when the equations $M_2$=64 and $N_2$=2401 hold.

Further, a crystal oscillator of which reference frequency $f_{REF2}$ is expressed by the equation $f_{REF2}$=3999.88 [kHz] is used as the reference signal source 206A in place of the above-described crystal oscillator. At that time, the value of the local oscillation frequency $f_{OSC2}$ becomes 150162.2 kHz when the equations $M_2$=24 and $N_2$=901 hold. Further, the value of the local oscillation frequency $f_{OSC2}$ becomes 150138.4 kHz when the equations $M_2$=28 and $N_2$=1051 hold. Still further, the value of the local oscillation frequency $f_{OSC2}$ becomes 150075.5 kHz when the equations $M_2$=50 and $N_2$=1876 hold. Still further, the value of the local oscillation frequency $f_{OSC2}$ becomes 150058 kHz when the equations $M_2$=64 and $N_2$=2401 hold.

In the case where the integers $M_1$ and $N_1$ are set in the tuner circuit 13 so that the equations $M_1$=28 and $N_1$=1050 hold in the example shown in FIG. 3A, and the integers $M_2$ and $N_2$ are set in the tuner circuit 14 so that the equations $M_2$=50 and $N_2$=1876 hold in the example shown in FIG. 3B, the value of the offset frequency $fL_0$ falls within the 71- to 89-kHz range, which satisfies an appropriate range (the 50- to 200-kHz range) of the offset frequency $fL_0$ of the above-described embodiment.

Figure 4A:
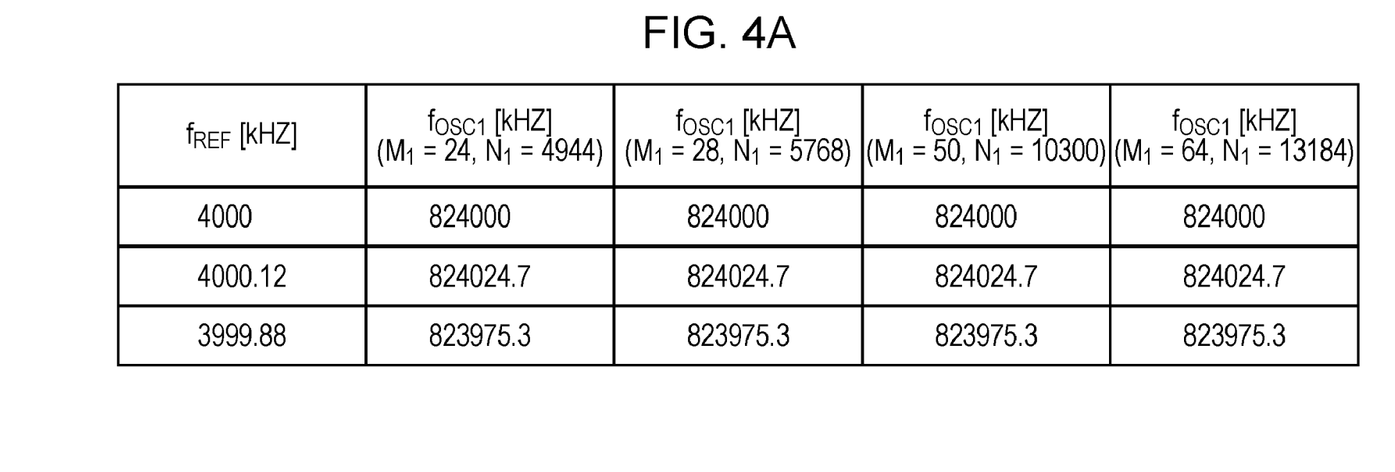
FIG. 4A shows a local oscillation frequency exemplarily set upon receiving a broadcast wave with UHF62ch and a tuning frequency $f_0$=767 MHz.
Figure 4B:
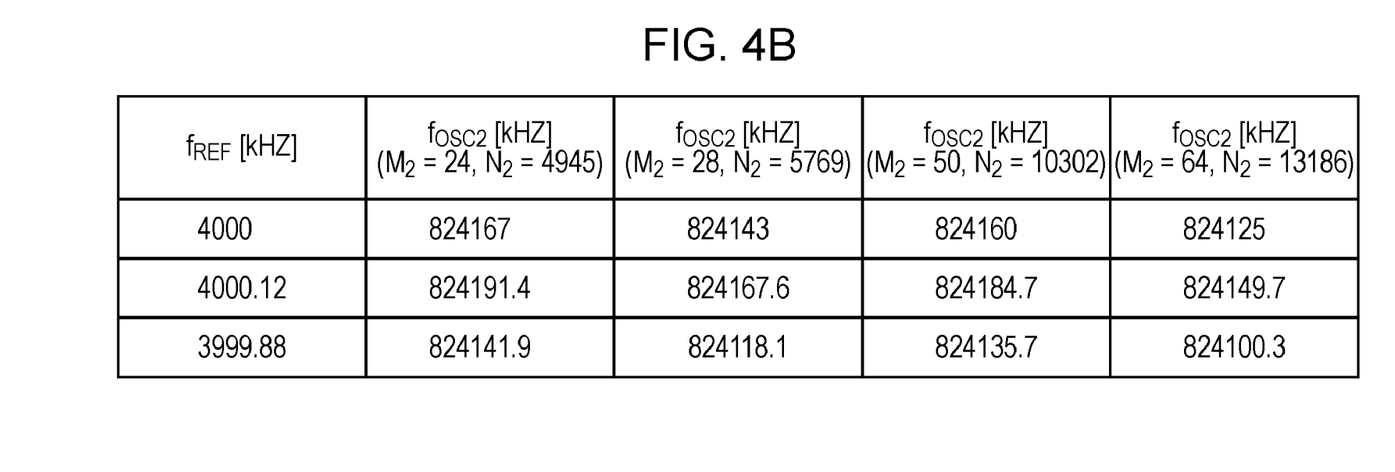
FIG. 4B shows another local oscillation frequency exemplarily set upon receiving the broadcast wave with UHF62ch and the tuning frequency $f_0$=767 MHz.

FIG. 4A shows a local oscillation frequency exemplarily set in the tuner circuit 13 upon receiving a broadcast wave with UHF62ch and a tuning frequency $f_0$=767 MHz in the above-described embodiment. FIG. 4B shows a local oscillation frequency exemplarily set in the tuner circuit 14 upon receiving the above-described broadcast wave.

As shown in FIG. 4A, the tuner circuit 13 includes a crystal oscillator with a reference frequency $f_{REF1}$=4000 [kHz], as the reference signal source 106A. At that time, the integers $M_1$ and $N_1$ are set so that each of the equations $M_1$=24 and $N_1$=4944, $M_1$=28 and $N_1$=5768, $M_1$=50 and $N_1$=10300, and $M_1$=64 and $N_1$=13184 holds. In any case, the local oscillation frequency $f_{OSC1}$ is expressed as the equation $f_{OSC1}$=824000.

Here, the crystal oscillator of which reference frequency $f_{REF1}$ is expressed by the equation $f_{REF1}$=4000.12 [kHz] is used as the reference signal source 106A in place of the above-described crystal oscillator. At that time, the local oscillation frequency $f_{OSC1}$ is expressed by the equation $f_{OSC1}$=824024.7 when each the equations $M_1$=24 and $N_1$=4944, $M_1$=28 and $N_1$=5768, $M_1$=50 and $N_1$=10300, and $M_1$=64 and $N_1$=13184 holds.

Further, the crystal oscillator of which reference frequency $f_{REF1}$ is expressed by the equation $f_{REF1}$=3999.88 [kHz] is used as the reference signal source 106A in place of the above-described crystal oscillator. At that time, the local oscillation frequency $f_{OSC1}$ is expressed by the equation $f_{OSC1}$=823975.3 when each of the equations $M_1$=24 and $N_1$=4944, $M_1$=28 and $N_1$=5768, $M_1$=50 and $N_1$=10300, and $M_1$=64 and $N_1$=13184 holds.

FIG. 4B shows an exemplarily set local oscillation frequency $f_{OSC2}$ of the local oscillation signal $S_{OSC2}$ oscillated by the PLL 206 included in the tuner circuit 14. In FIG. 4B, the integer $N_2$ is set so that the equation $N_2$=$N_1$+1 holds in the tuner circuit 14. As shown in FIG. 4B, the tuner circuit 14 includes the crystal oscillator with the reference frequency $f_{REF2}$=4000 [kHz], as the reference signal source 206A. At that time, the integers $M_2$ and $N_2$ are set so that each of the equations $M_2$=24 and $N_2$=4945, $M_2$=28 and $N_2$=5769, $M_2$=50 and $N_2$=10302, and $M_2$=64 and $N_2$=13186 holds. In that case, the local oscillation frequency $f_{OSC2}$ becomes each of 824167 kHz, 824143 kHz, 824160 kHz, and 824125 kHz.

Here, the crystal oscillator of which reference frequency $f_{REF2}$ is expressed by the equation $f_{REF2}$=4000.12 [kHz] is used as the reference signal source 206A in place of the above-described crystal oscillator. At that time, the value of the local oscillation frequency $f_{OSC2}$ becomes 824191.4 kHz when the equations $M_2$=24 and $N_2$=4945 hold. Further, the value of the local oscillation frequency $f_{OSC2}$ becomes 824167.6 kHz when the equations $M_2$=28 and $N_2$=5769 hold. Still further, the value of the local oscillation frequency $f_{OSC2}$ becomes 824184.7 kHz when the equations $M_2$=50 and $N_2$=10302 hold. Still further, the value of the local oscillation frequency $f_{OSC2}$ becomes 824149.7 kHz when the equations $M_2$=64 and $N_2$=13186 hold.

Further, the crystal oscillator of which reference frequency $f_{REF2}$ is expressed by the equation $f_{REF2}$=3999.88 [kHz] is used as the reference signal source 206A in place of the above-described crystal oscillator. At that time, the value of the local oscillation frequency $f_{OSC2}$ becomes 824141.9 kHz when the equations $M_2$=24 and $N_2$=4945 hold. Further, the value of the local oscillation frequency $f_{OSC2}$ becomes 824118.1 kHz when the equations $M_2$=28 and $N_2$=5769 hold. Still further, the value of the local oscillation frequency $f_{OSC2}$ becomes 824135.7 kHz when the equations $M_2$=50 and $N_2$=10302 hold. Still further, the value of the local oscillation frequency $f_{OSC2}$ becomes 824100.3 kHz when the equations $M_2$=64 and $N_2$=13186 hold.

In the case where the integers $M_1$ and $N_1$ are set in the tuner circuit 13 so that the equations $M_1$=28 and $N_1$=5768 hold in the example shown in FIG. 4A, and the integers $M_2$ and $N_2$ are set in the tuner circuit 14 so that the equations $M_2$=64 and $N_2$=13186 hold in the example shown in FIG. 4B, the value of the offset frequency $fL_0$ falls within the 75.6- to 174.4-kHz range, which satisfies an appropriate range (the 50- to 200-kHz range) of the offset frequency $fL_0$ of the above-described embodiment.

Thus, in the tuner device 1 of the above-described embodiment, a dividing ratio $M_1/N_1$ set in the tuner circuit 13 and a dividing ratio $M_2/N_2$ set in the tuner circuit 14 are relative to each other. Namely, there are variations in the frequencies of reference signals oscillated by the reference signal sources 106A and 206A that are provided in the individual tuner circuits 13 and 14. When the difference between the above-described variations is maximized, the tuner device 1 sets the dividing ratios $M_1/N_1$ and $M_2/N_2$ that can ensure an offset frequency of 50 kHz or more.

Consequently, even though the tuner circuit 13 has the same hardware configuration as that of the tuner circuit 14, the tuner circuits 13 and 14 being provided in the tuner device 1, it becomes possible to obtain local oscillation frequencies that hardly disturb each other. Further, since the reference frequencies $f_{REF1}$ and $f_{REF2}$ are not changed, it becomes possible to attain a configuration that does not change the shift width of each of desired local oscillation frequencies.

2. Exemplary Modification

As a matter of course, the present invention is not limited to the above-described embodiment, but can be modified in various ways without leaving the scope of the spirit of the present invention.

According to the above-described embodiment, the tuner device 1 receives the broadcast wave of the terrestrial television broadcasting. However, the tuner device 1 may have any configuration so long as the tuner circuits 13 and 14 can receive broadcast waves of the same frequency. Therefore, the tuner device 1 may be configured to receive a broadcast wave of satellite television broadcasting (e.g., broadcasting satellite (BS) analog broadcasting, BS digital broadcasting, communication satellite (CS) digital broadcasting, and so forth) in place of that of the terrestrial television broadcasting.

Further, in the above-described embodiment, a combination of the integers $M_1$ and $N_1$, and the integers $M_2$ and $N_2$ is set through a host microcomputer connected to the tuner device 1 and data of the combination is stored in the table provided in the memory of the host microcomputer. However, the tuner device 1 may include a microcomputer (not shown) to perform the same control as that performed by the above-described host microcomputer. In that case, the microcomputer may not store the combination data in a memory. Namely, the tuner device 1 may set $N_1/M_1$ and $N_2/M_2$ based on the frequency of a broadcast wave each time the tuner device 1 receives the broadcast wave.

Further, even though the tuner device 1 of the above-described embodiment is configured so that the tuner circuits 13 and 14 are provided in a single cabinet, the tuner circuits 13 and 14 may be provided in separate cabinets. Since the tuner circuits 13 and 14 may also disturb each other due to the leakage of the local oscillation signals in that circumstance, the present invention is effectively performed. Further, even though the tuner device 1 of the above-described embodiment includes the two tuner circuits, the number of the tuner circuits may be an arbitrary number which is greater than or equal to two. In that case, an appropriate dividing ratio may be selected between tuner circuits adjacent to each other, for example.

The present application contains subject matter related to that disclosed in Japanese Priority Patent Application JP 2008-281571 filed in the Japan Patent Office on Oct. 31, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A tuner device comprising:
a plurality of tuner circuits, where each of the tuner circuits includes a radio frequency amplifier configured to amplify a radio frequency signal of a transmitted broadcast wave, a frequency mixing circuit configured to perform frequency conversion for the radio frequency signal transmitted from the radio frequency amplifier, and a local oscillation circuit configured to transmit a local oscillation signal to the frequency mixing circuit,
wherein the local oscillation circuit includes, at least, a reference signal source, a first frequency divider, and a second frequency divider, oscillates a local oscillation signal having a local oscillation frequency $f_{OSC}=f_{REF}\times N/M$ which is expressed by using a reference frequency $f_{REF}$ of the reference signal source, a first dividing ratio $1/M$ of the first frequency divider, and a second dividing ratio $1/N$ of the second frequency divider, wherein M and N are positive integers, and makes a difference between local oscillation frequencies of the plurality of tuner circuits greater than or equal to a predetermined value, the difference being generated when each of the plurality of tuner circuits receives the transmitted broadcast wave of a tuning frequency.

2. The tuner device according to claim 1, further comprising a storage unit configured to store data of a combination of the M and N for each tuning frequency of the transmitted broadcast wave.

3. The tuner device according to claim 2, further comprising a control unit configured to perform control so as to read the data of the combination of the M and N, the combination being generated for each of the tuner circuits in accordance with the tuning frequency of the transmitted broadcast wave, and set the read data to the local oscillation circuit.

4. The tuner device according to claim 1, wherein the predetermined value is a value which reduces a disturbance occurring between the plurality of tuner circuits.

5. The tuner device according to claim 4, further comprising a filter configured to limit a frequency band of a signal transmitted from the frequency mixing circuit,
wherein when each of the plurality of tuner circuits receives the broadcast wave of the tuning frequency at a same time, a difference between the local oscillation frequencies of the tuner circuits is greater than or equal to the predetermined value and smaller than or equal to a value which allows a passage through the filter.

6. The tuner device according to claim 5, wherein the difference between the local oscillation frequencies of the plurality of tuner circuits falls within 50 kHz to 200 kHz.

7. The tuner device according to claim 1,
wherein the local oscillation circuit further includes:
a voltage controlled oscillator, and
a phase frequency detector,
wherein when the first dividing ratio $1/M$ and the second dividing ratio $1/N$ are set in accordance with the tuning frequency of the transmitted broadcast wave,
the first frequency divider frequency-divides a reference signal transmitted from the reference signal source at the first dividing ratio $1/M$, and
the second frequency divider frequency-divides a signal transmitted from the voltage controlled oscillator at the second dividing ratio $1/N$, and
wherein the phase frequency detector compares a phase of a signal transmitted from the first frequency divider and a phase of a signal transmitted from the second frequency divider.

8. The tuner device according to claim 7, wherein the reference signal source has variations in frequencies of the reference signals of the tuner circuits, and sets the first and second dividing ratios that can ensure a difference greater than or equal to the predetermined value when a difference between the variations in the frequencies of the reference signals is maximized.

9. The tuner device according to claim 1, further comprising a demodulator configured to demodulate a signal transmitted from at least one of the plurality of tuner circuits.

10. The tuner device according to claim 1 configured to receive a broadcast wave of terrestrial television broadcasting.

11. The tuner device according to claim 1 configured to receive a broadcast wave of satellite television broadcasting.

* * * * *